(12) United States Patent
Seki

(10) Patent No.: US 8,198,904 B2
(45) Date of Patent: Jun. 12, 2012

(54) SYNCHROPHASOR MEASURING DEVICE AND INTER-BUS-LINE PHASE ANGLE DIFFERENCE MEASUREMENT UNIT USING THE SAME

(75) Inventor: Kempei Seki, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 428 days.

(21) Appl. No.: 12/527,471

(22) PCT Filed: Mar. 30, 2007

(86) PCT No.: PCT/JP2007/057057
§ 371 (c)(1),
(2), (4) Date: Aug. 17, 2009

(87) PCT Pub. No.: WO2008/126240
PCT Pub. Date: Oct. 23, 2008

(65) Prior Publication Data
US 2010/0072978 A1    Mar. 25, 2010

(51) Int. Cl.
*G01R 27/28* (2006.01)
*G01R 25/00* (2006.01)
(52) U.S. Cl. .......................................... 324/650; 702/65
(58) Field of Classification Search .................. 324/650, 324/649, 600, 522, 713; 702/65, 64, 57, 702/1
See application file for complete search history.

(56) References Cited

U.S. PATENT DOCUMENTS

| 4,800,291 | A | * | 1/1989 | Bowers ........................... 307/87 |
| 5,832,414 | A | | 11/1998 | Hart et al. |
| 6,662,124 | B2 | * | 12/2003 | Schweitzer et al. ............ 702/65 |
| 2004/0243329 | A1 | | 12/2004 | Seki |
| 2005/0151532 | A1 | | 7/2005 | Seki |
| 2006/0247874 | A1 | | 11/2006 | Premerlani et al. |

FOREIGN PATENT DOCUMENTS

| JP | 2004-361124 A | 12/2004 |
| JP | 2005-204367 A | 7/2005 |
| JP | 2006-179323 A | 7/2006 |
| WO | WO 03/090327 | 10/2003 |
| WO | WO 2008/114328 A1 | 9/2008 |

OTHER PUBLICATIONS

"IEEE Standard for Synchrophasors for Power Systems" IEEE Power Engineering Society, IEEE Std C37.118™-2005, pp. 1-57.
Hashiguchi et al., "Analysis of Generator Oscillation Characteristics Based on Multiple Synchronized Phasor Measurements" IEEJ Trans, PE, 2003, vol. 123, No. 12, pp. 1471-1479.

(Continued)

*Primary Examiner* — Hoai-An D Nguyen
(74) *Attorney, Agent, or Firm* — Buchanan Ingersoll & Rooney PC

(57) ABSTRACT

Voltage instantaneous value time-series estimation data and a present-time voltage estimation value are calculated by using an actually-measured frequency and voltage instantaneous value time-series data according to a least square method. A present-time voltage effective value is determined by using the calculated voltage instantaneous value time-series estimation data, and a present-time synchrophasor, a voltage distortion degree and an inter-bus-line synchrophasor phase angle difference are determined by using the present-time voltage effective value and the present-time voltage estimation value.

5 Claims, 17 Drawing Sheets

OTHER PUBLICATIONS

Phadke A G et al., "A New Measurement Technique for Tracking Voltage Phasors, Local System Frequency, and Rate of Change of Frequency" IEEE Transactions on Power Apparatus and Systems, IEEE Inc., May 1, 1983, vol. PAS-102, No. 5, pp. 1025-1038, XP008065061.

Supplementary European Search Report issued in the corresponding European Application No. 07740493.7-1524 dated Jul. 2, 2010.

International Search Report (PCT/ISA/210) for PCT/UP2007/057057 completed Jun. 19, 2007.

* cited by examiner

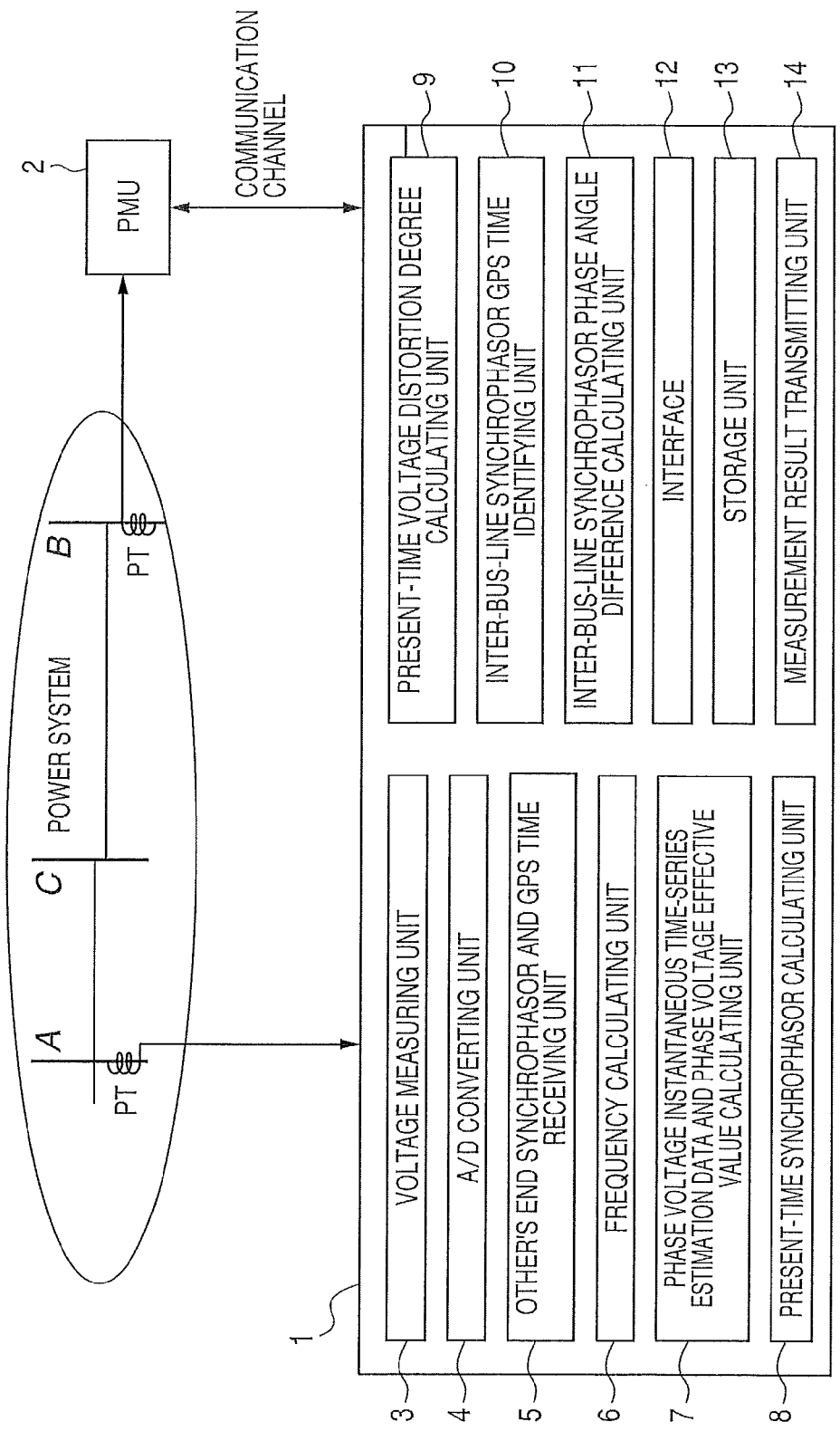
[FIG. 1]

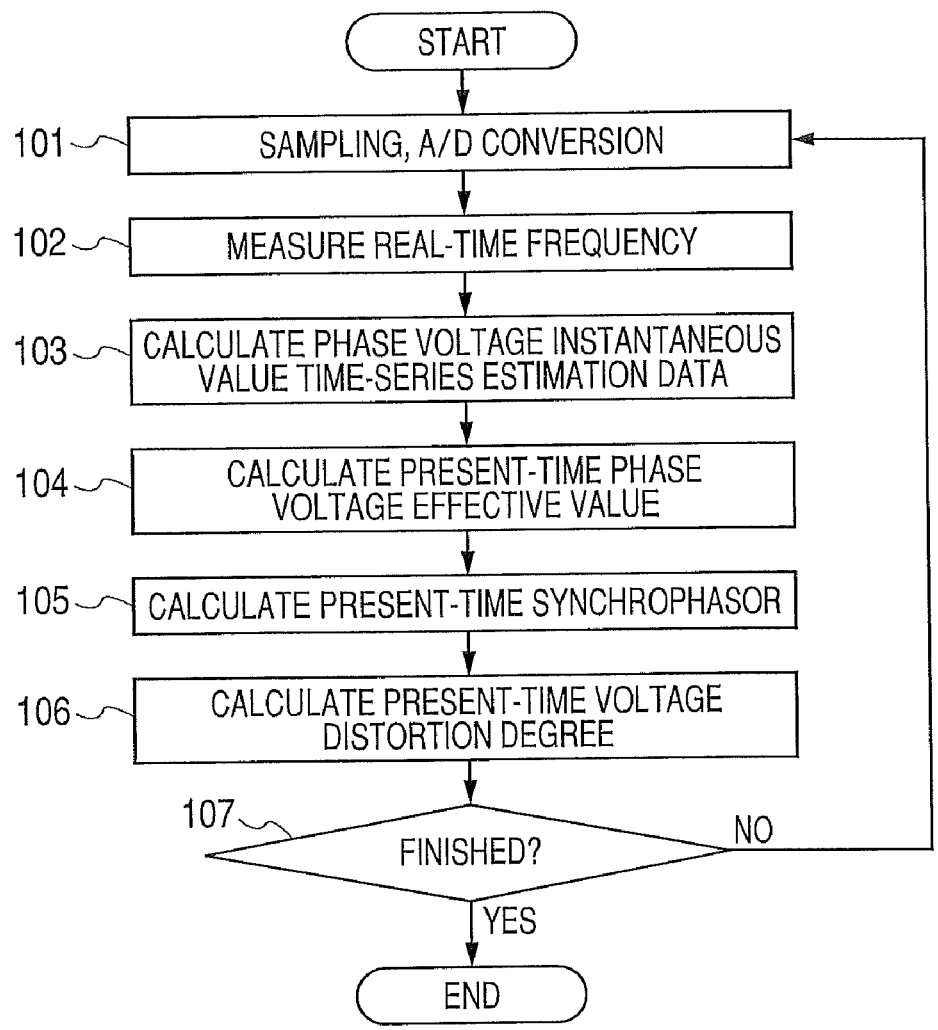

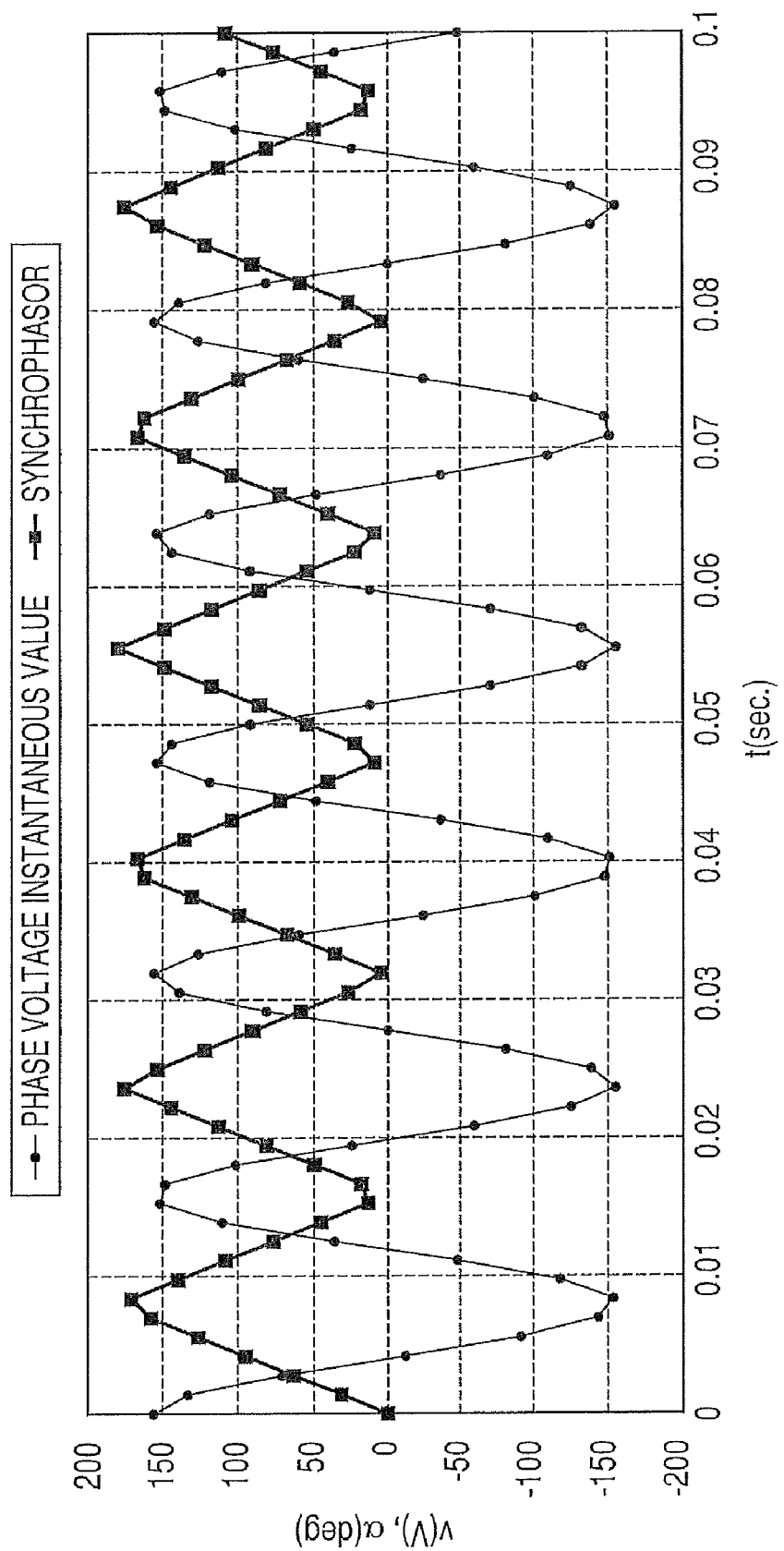
[FIG. 3]

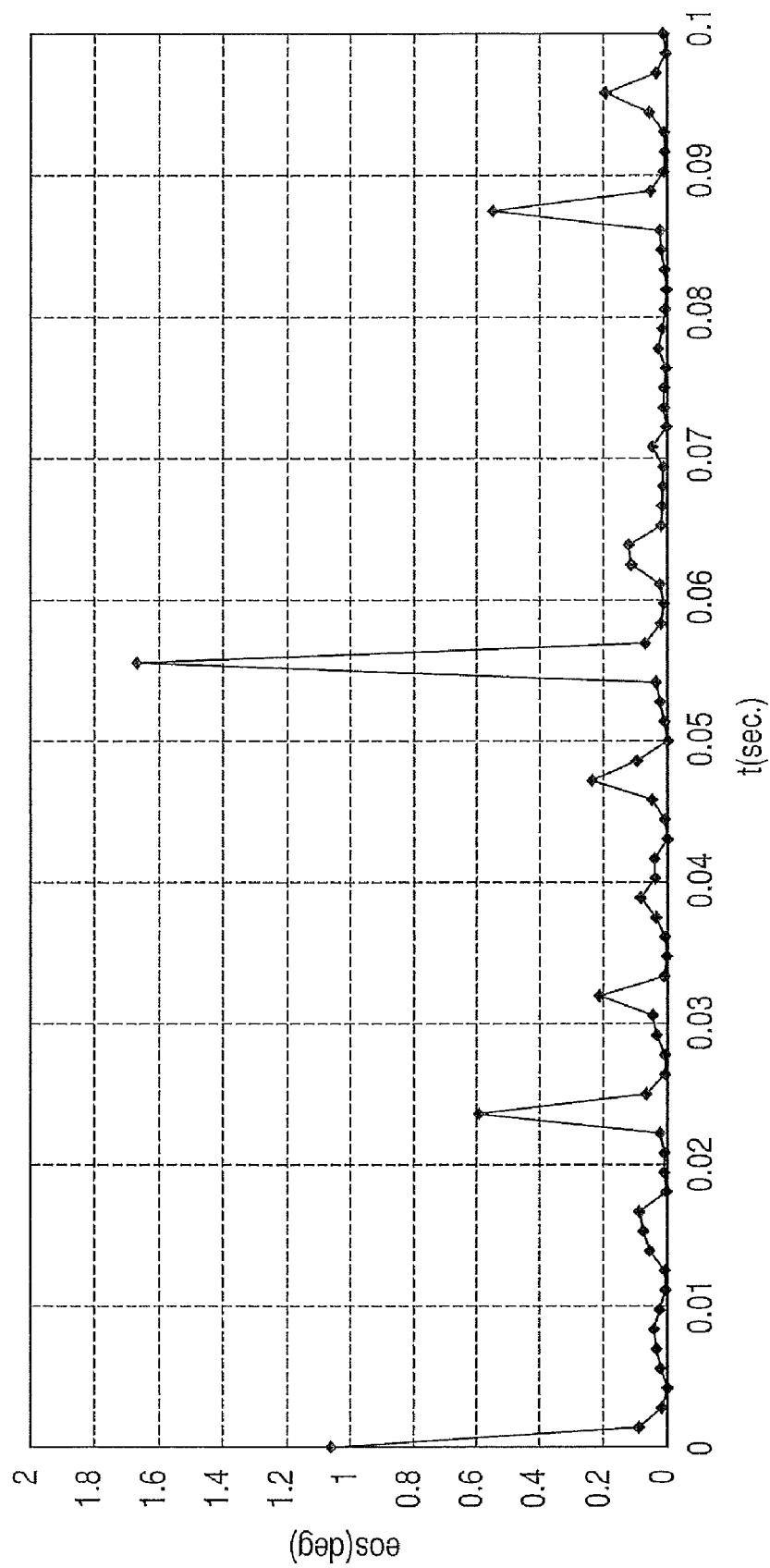
[FIG. 4]

[FIG. 5]
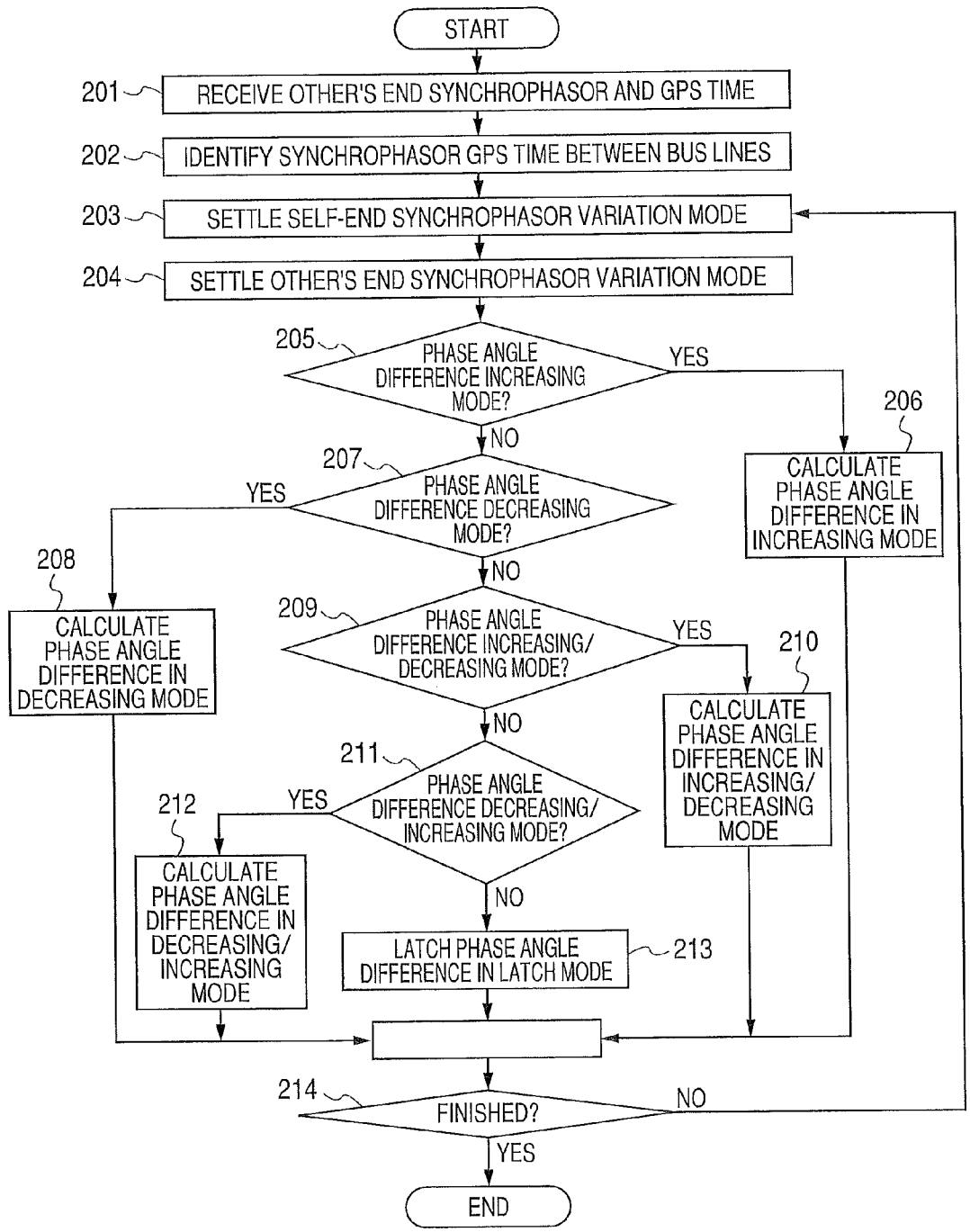

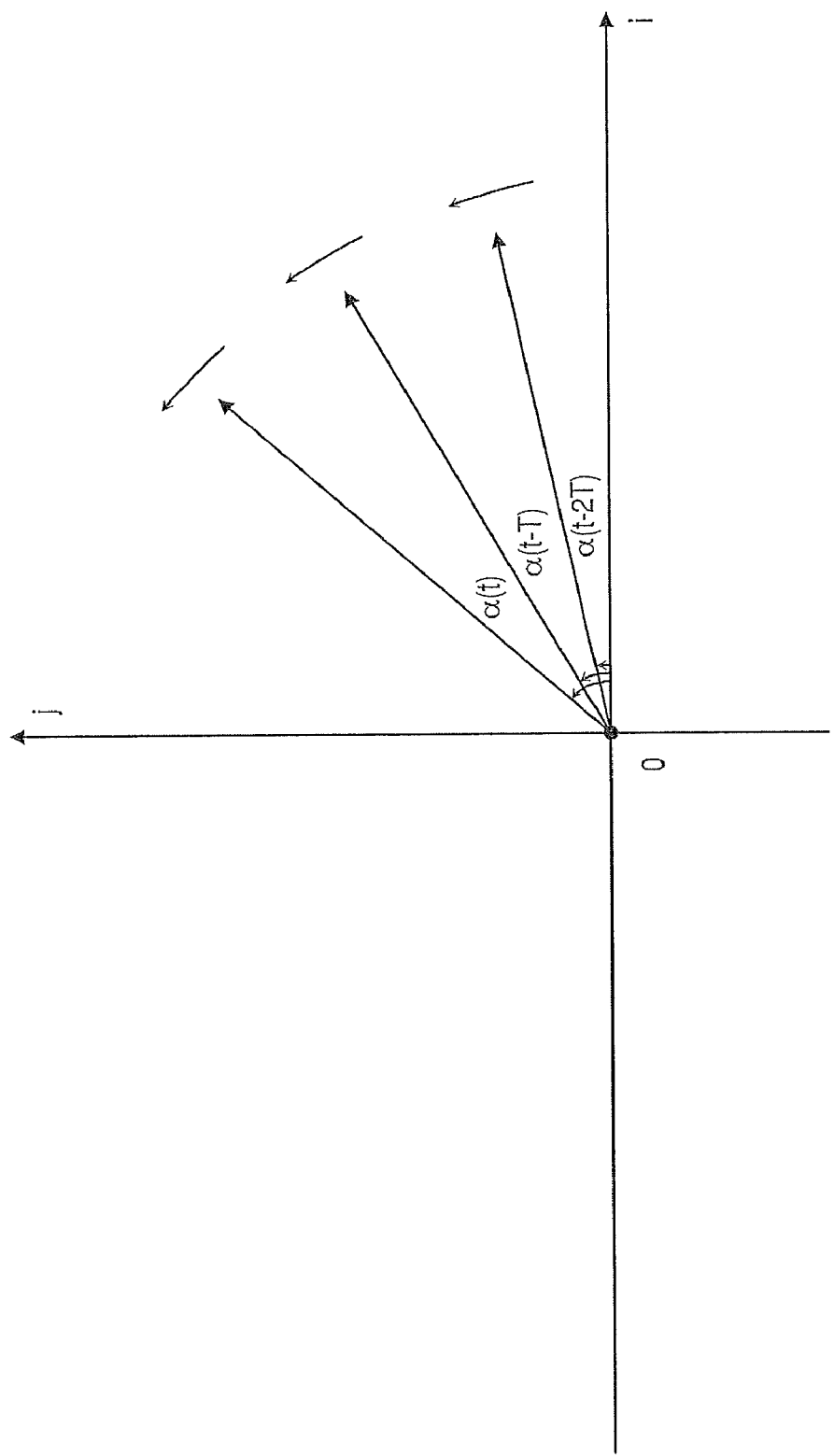
[FIG. 6]

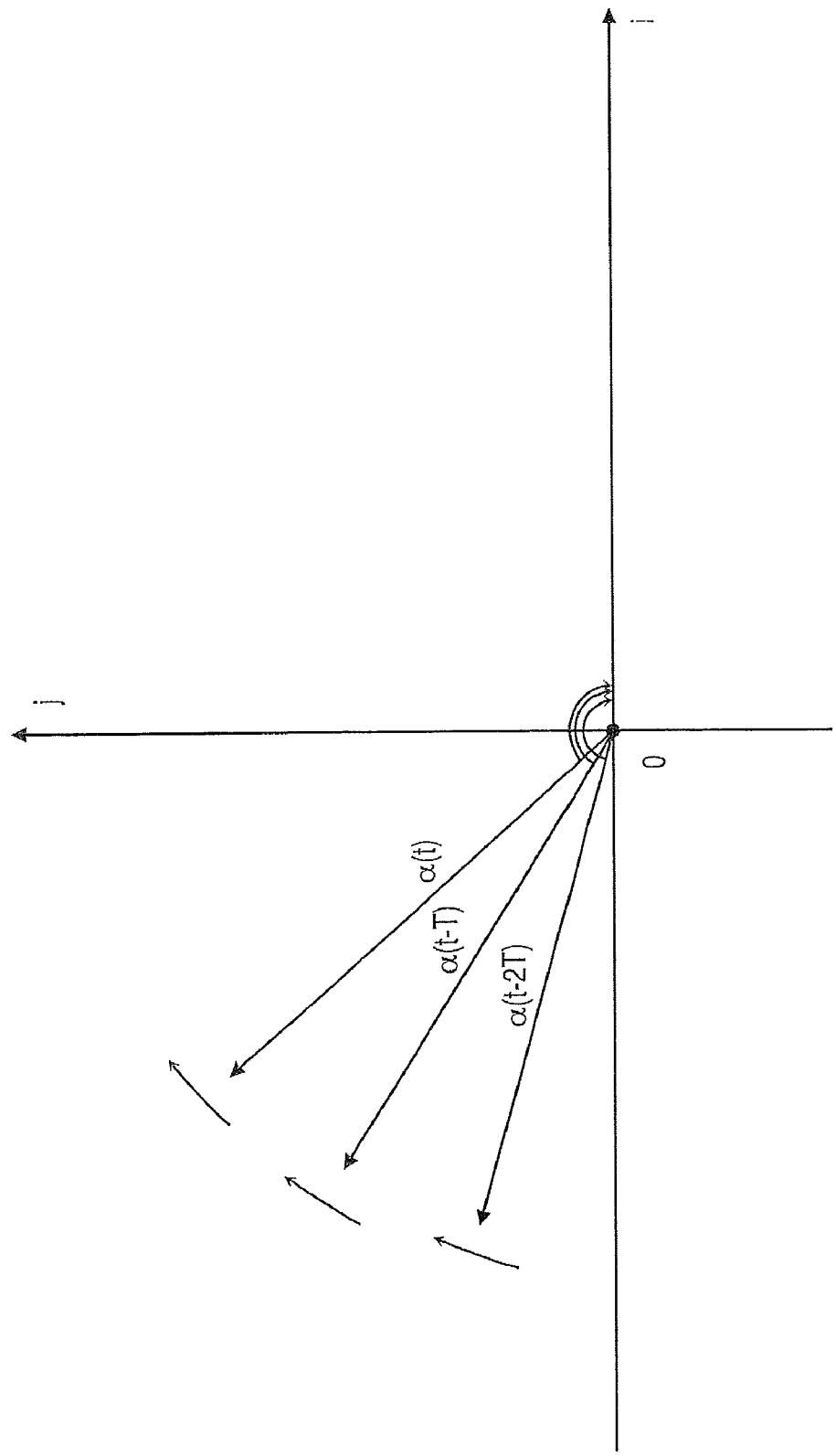
[FIG. 7]

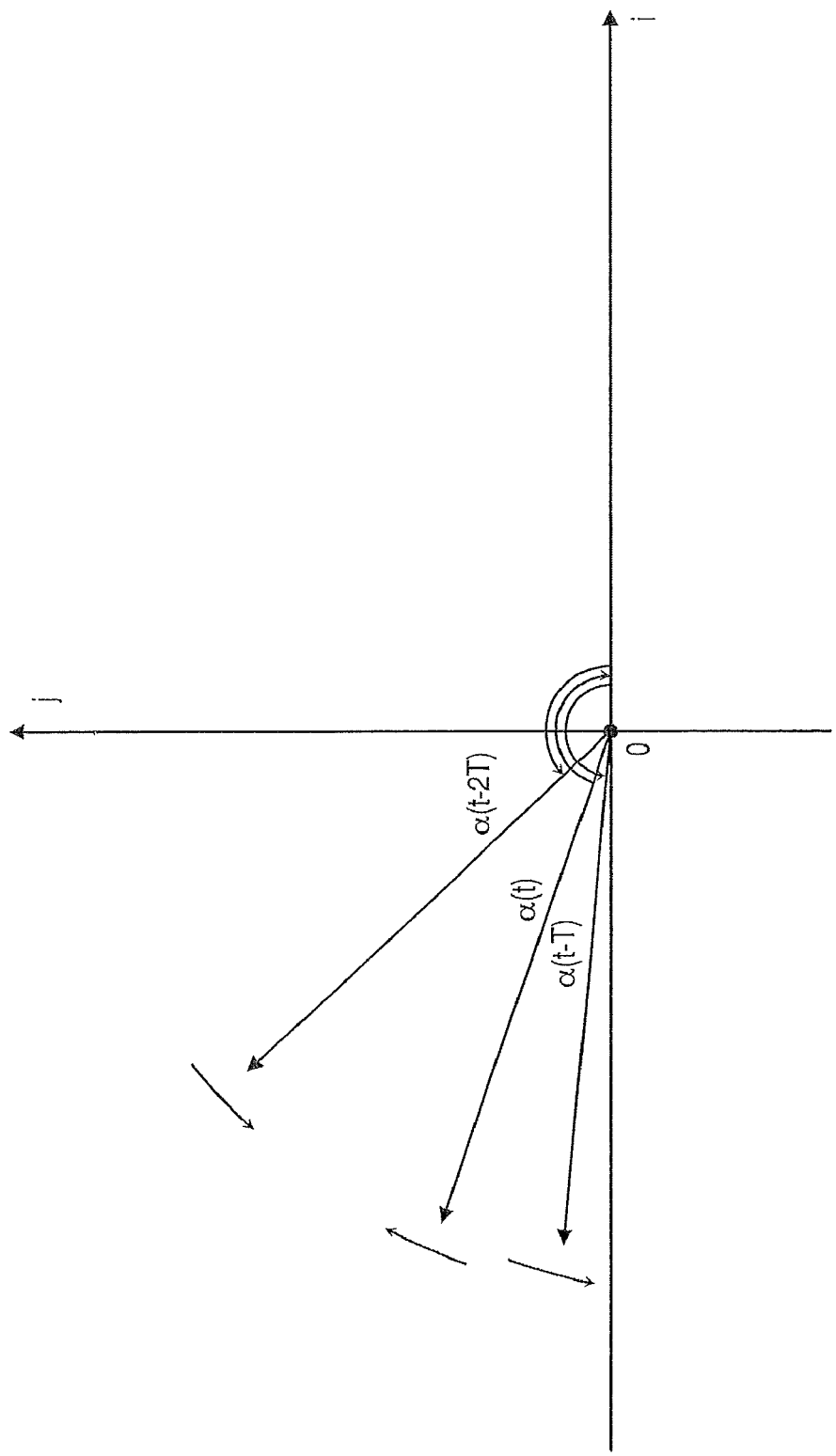
[FIG. 8]

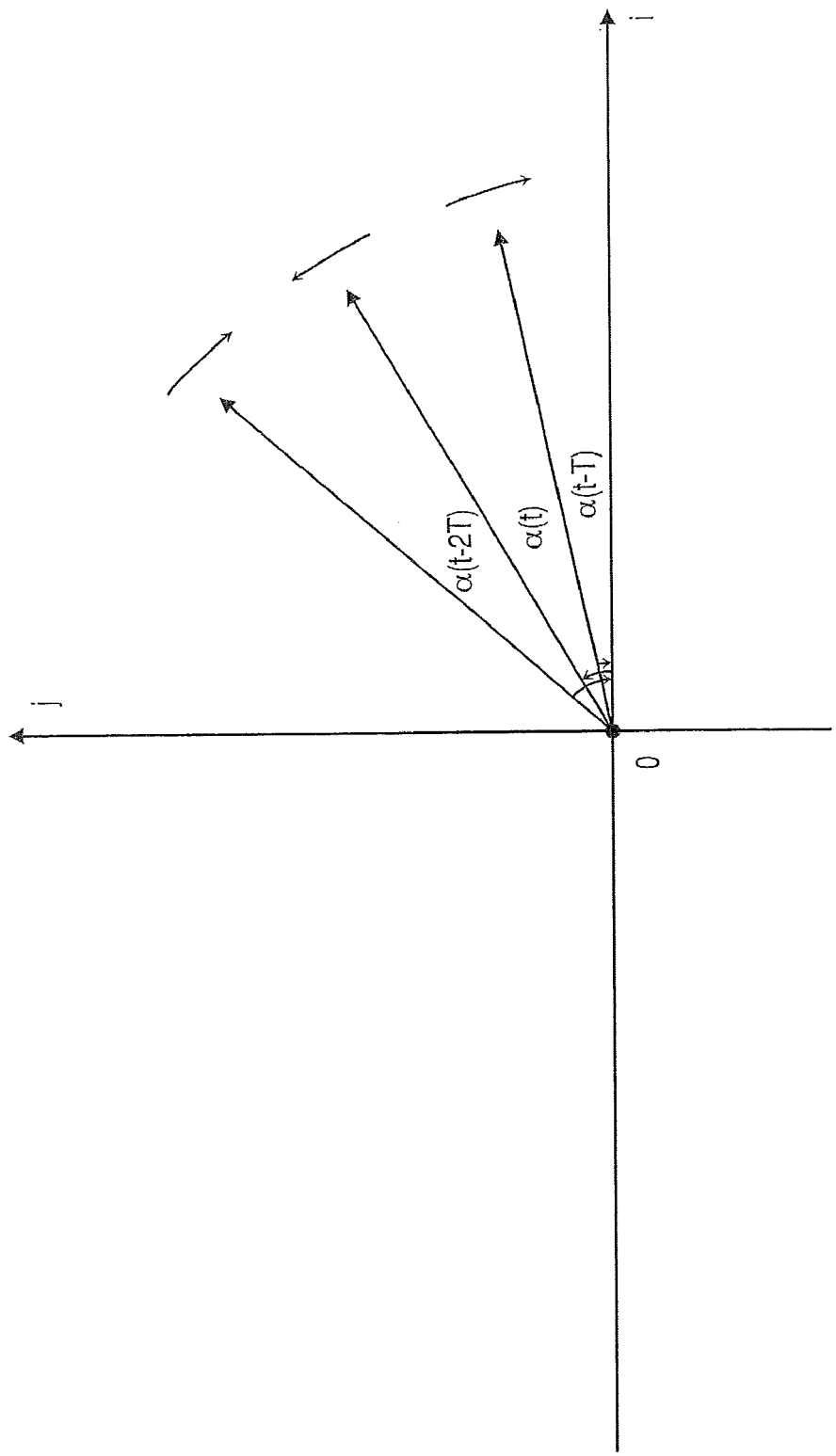
[FIG. 9]

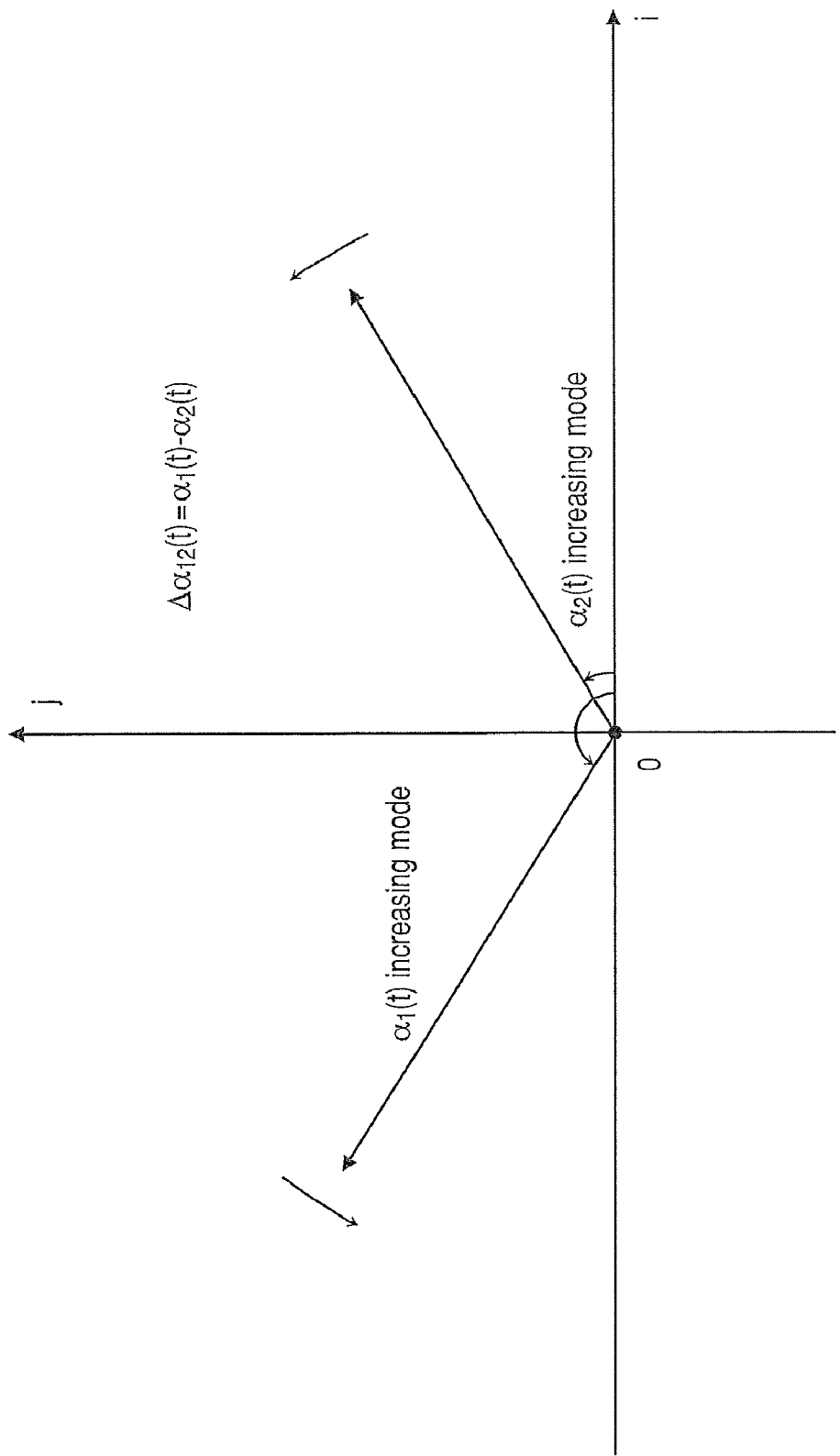

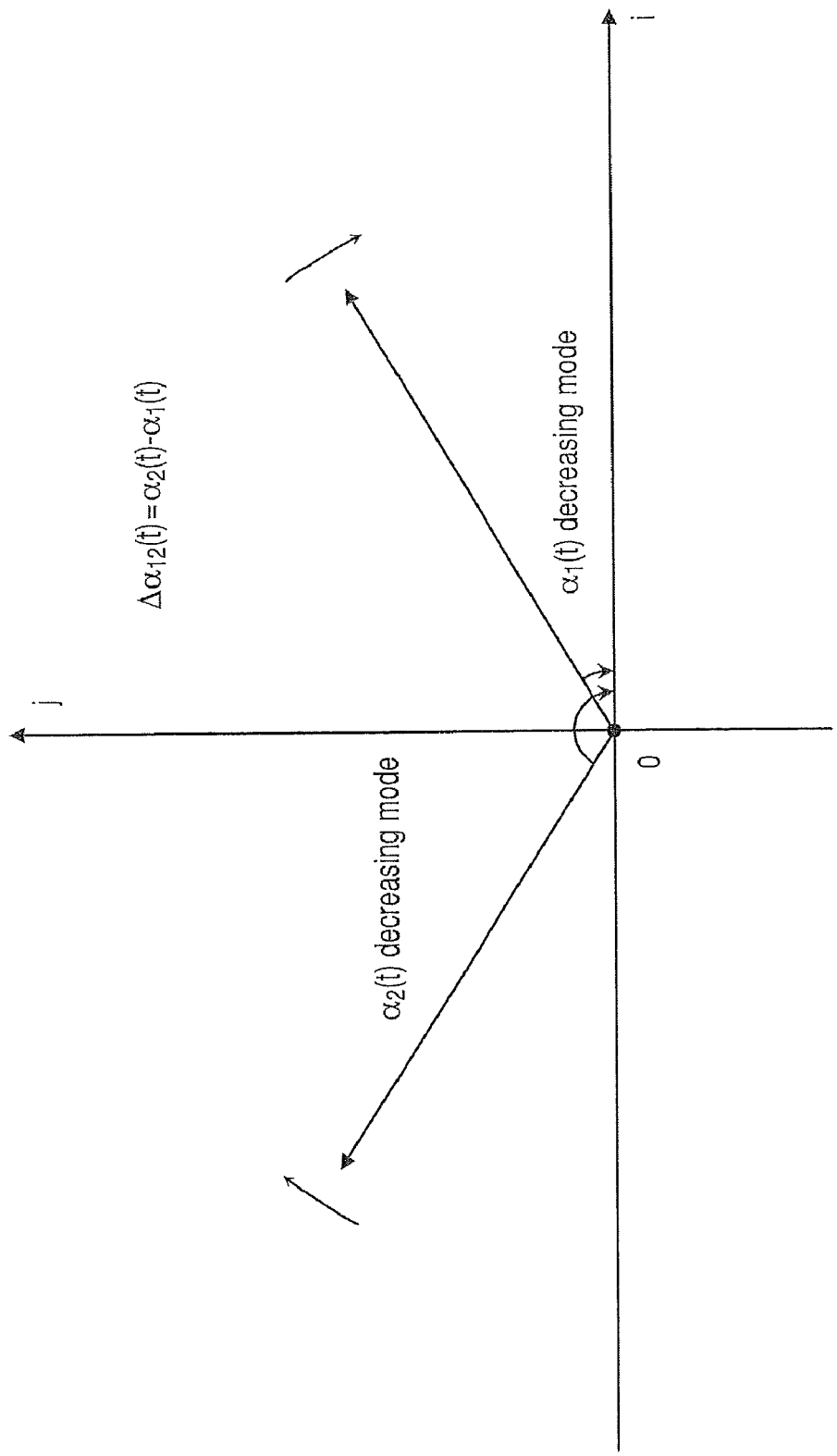

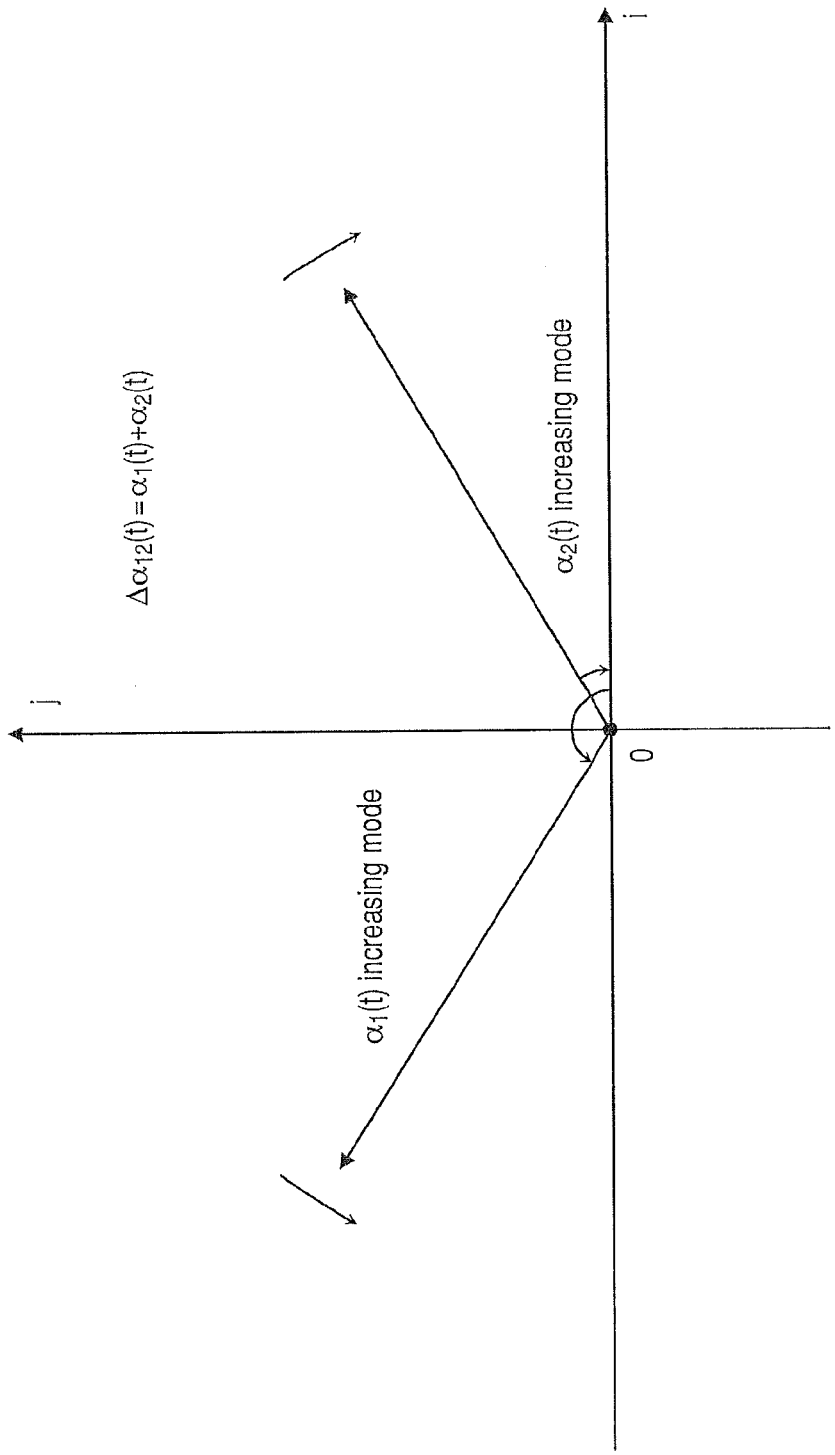

[FIG. 13]
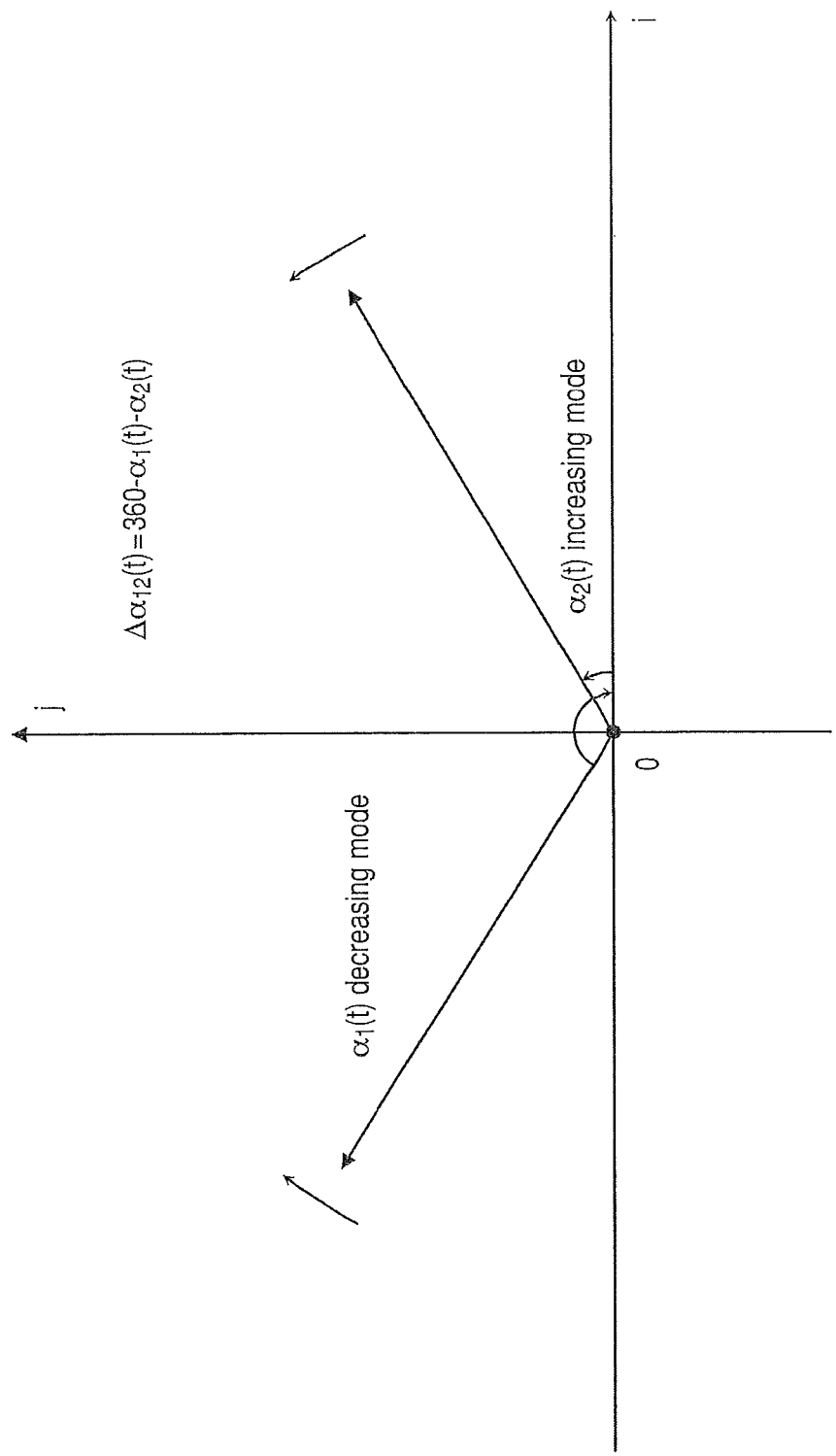

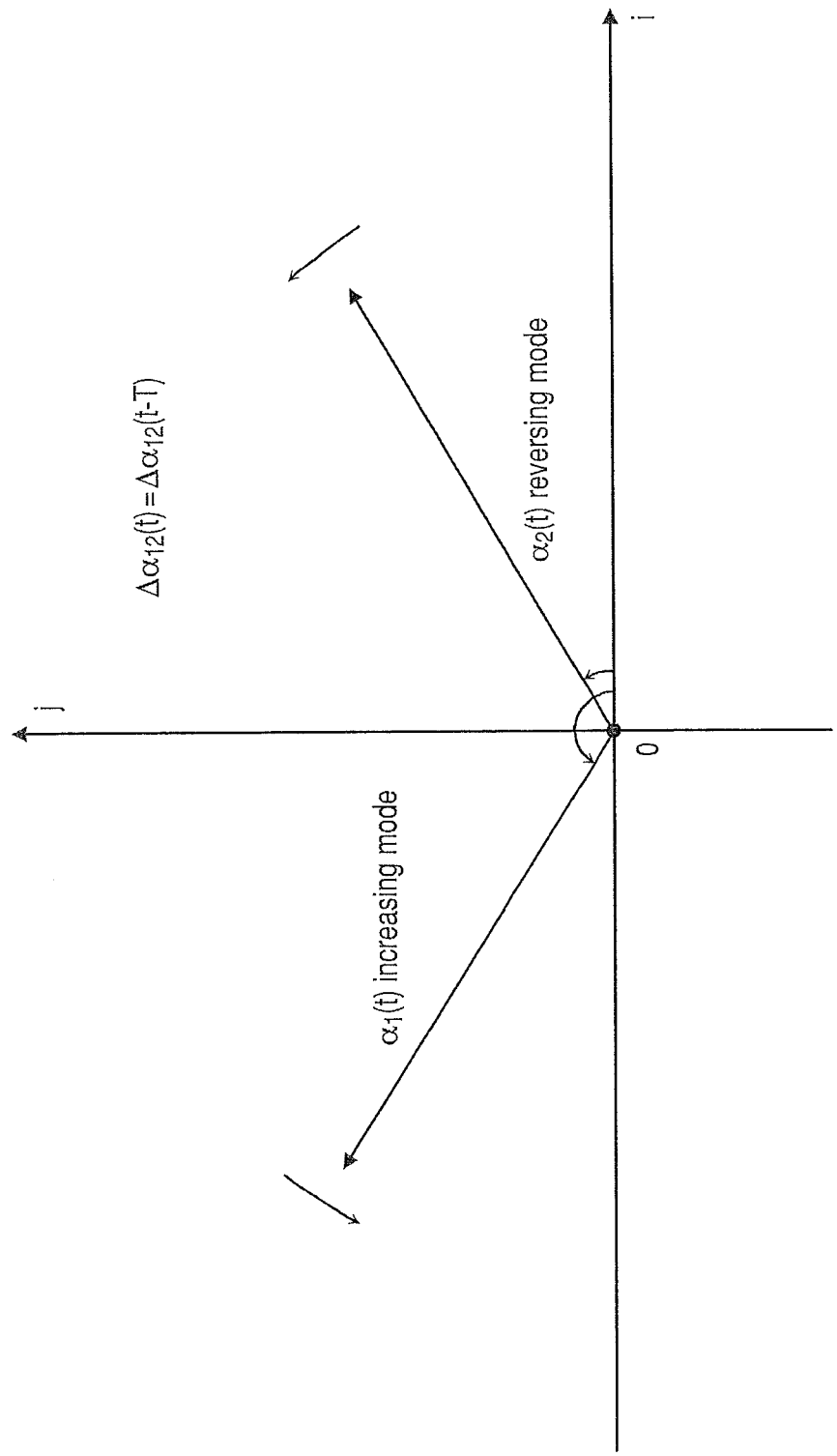
[FIG. 14]

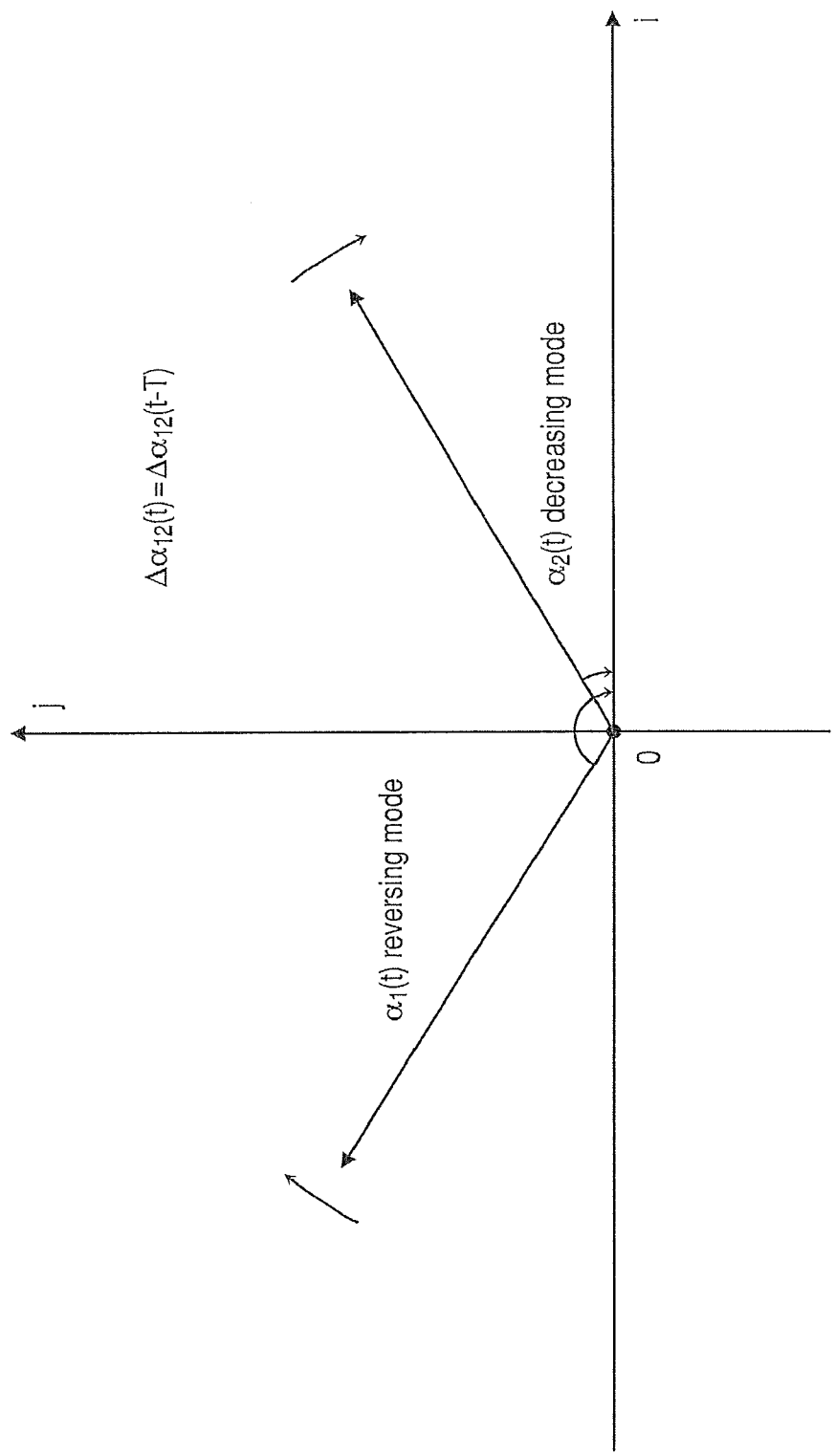

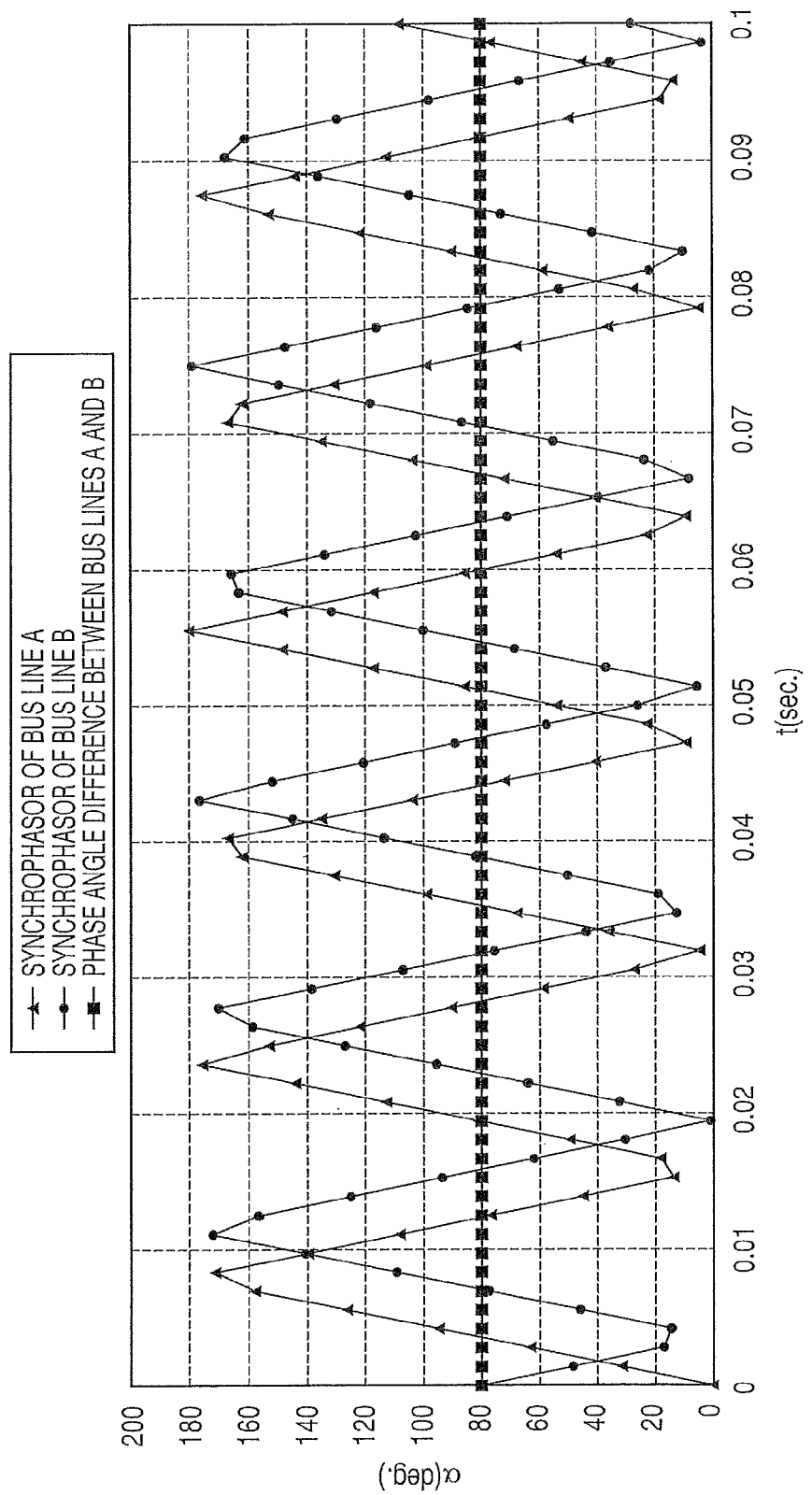
[FIG. 16]

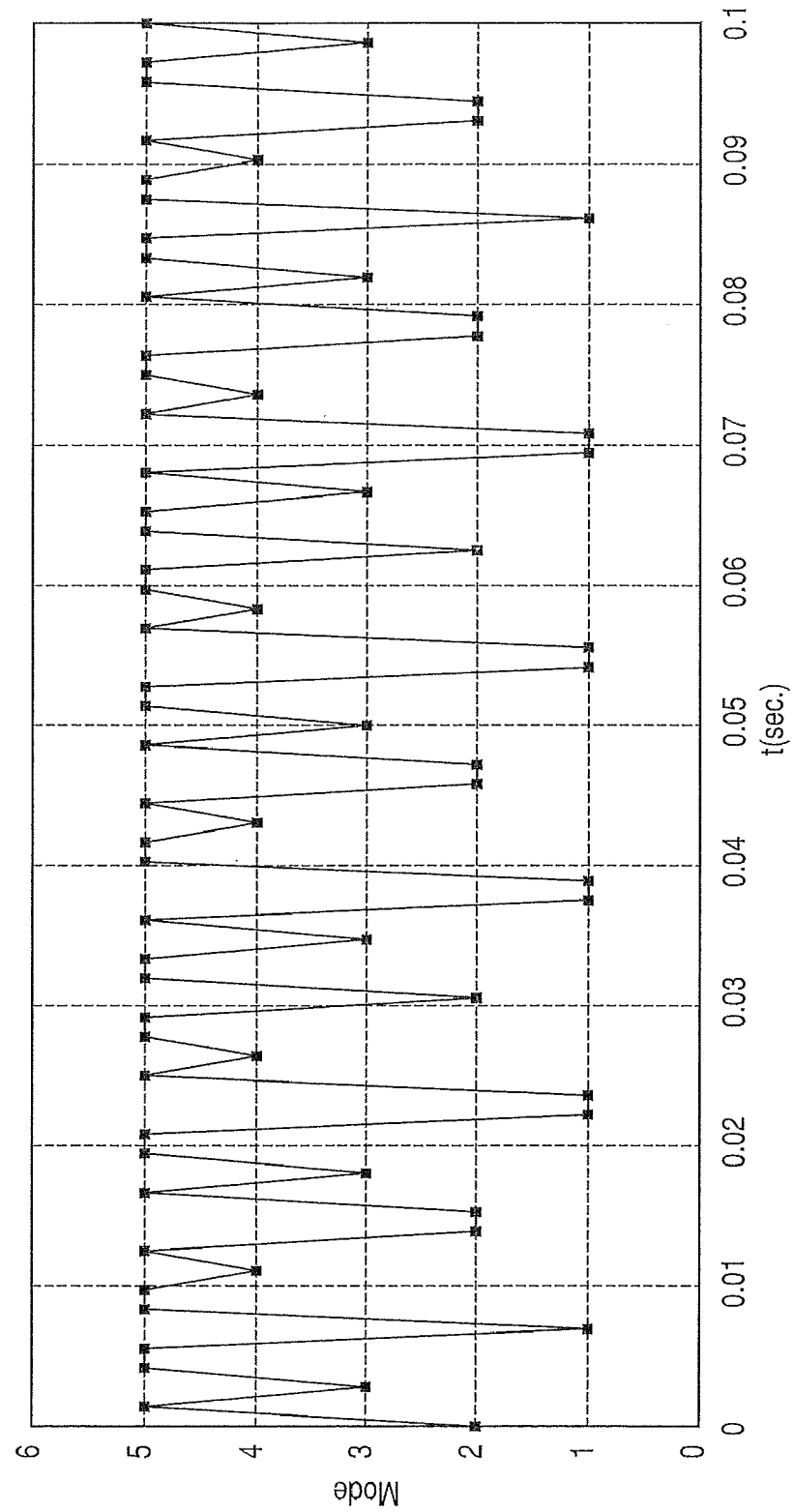
[FIG. 17]

SYNCHROPHASOR MEASURING DEVICE AND INTER-BUS-LINE PHASE ANGLE DIFFERENCE MEASUREMENT UNIT USING THE SAME

TECHNICAL FIELD

The present invention relates to a synchrophasor measuring device using a real-time frequency obtained by a dynamic frequency measuring method, and a phasor measurement unit using the same.

BACKGROUND ART

In connection with complication of tidal current in a electrical power system, control protection has been recently required to high-reliability and high-precision power system, and the necessity of enhancing the performance of a synchrophasor and a phasor measurement unit (PMU) has been increased.

A reference wave comparison system and a one-cycle integration system are mainly known for a synchrophasor measuring device used in the control protection for this type of power system. According to the reference wave comparison system, PMU has a reference wave of a system rated frequency and a GPS time therein, input data is compared with the reference wave and the difference between the input data and the reference wave is set as a synchrophasor. A problem of the reference wave system resides in that an error is very large because this system is a difference calculation system based on only one point (the difference calculation between the input data and the reference wave point at the same time) and thus no stable value is obtained although averaging processing or the like is executed (see Non-patent Document 1).

According to the one-cycle integration system, the self-end synchrophasor is calculated by integration calculation of one cycle. The calculating equation of the one-cycle integration system is as follows.

$$V = \frac{\sqrt{2}}{N}\left\{\sum_{k=1}^{N} V_k \cdot \sin(k\theta) + j\sum_{k=1}^{N} V_k \cdot \cos(k\theta)\right\}$$

V: phasor expression,
$V_k$: sampling data,
N: sampling number per period
θ: sampling angle,
θ=tan$^{-1}$ {Im(V)/Re(V)}
This system has a problem that the calculation error of the above calculating equation is very large when the system frequency is deviated from the rated frequency (see Non-patent Document 2).

As described above, both the present two systems imitate an alternating-current waveform on the basis of a real-number instantaneous time. According to these methods, for example, a voltage instantaneous value waveform is discomposed by Fourier transform, a fundamental wave at the center thereof (synchrophasor) is extracted, and then the frequency of the fundamental wave is determined. Furthermore, it is also required to correct each alternating-current electric quantity on the basis of a frequency-gain characteristic curve. As described above, in the conventional systems described above, a delay time element such as Fourier transform, frequency-gain correction processing, averaging processing or the like is introduced, and thus no real-time measurement value is obtained. Accordingly, these systems have a drawback that it is impossible to measure a high-speed and high-precision synchrophasor and a phase angle difference between bus lines.

Non-patent Document 1: "IEEE Standard for Synchrophasors" C37. 118-2005)
Non-patent Document 2: "IEEJ Trans. PE, vol. 123, No. 12, pp 1471-1479, 2003"
Patent document 1: PCT/JP2007/052967 (Previous Application of this invention)

DISCLOSURE OF THE INVENTION

Problem to be Solved by the Invention

The present invention has been implemented in view of the foregoing problem, and has an object to implement a high-speed and high-precision synchrophasor and a phasor measurement unit by using a real-time frequency obtained according to a dynamic frequency measuring method which has been proposed by the inventor of this application.

The present invention has another object to implement system protection control that can measure a present-time voltage distortion degree by using a present-time synchrophasor measured by the synchrophasor measuring device, and simply discriminate a frequency deviation and a noise from each other,

Means of Solving the Problem

A synchrophasor measuring device according to the present invention comprises: a voltage measuring unit for measuring a time-series data associated with a system voltage; a frequency calculating unit for determining the amplitude, chord length and rotational phase angle of a voltage rotational vector from the time-series data obtained by the voltage measuring unit according to an integration method and calculating a real-time frequency by identifying a frequency variation rate step by step; a voltage instantaneous value time-series estimation data and voltage effective value calculating unit for calculating a voltage instantaneous value time-series estimation data and a voltage effective value for estimating a sinusoidal coefficient parameter according to a least square method by using the real-time frequency and input voltage instantaneous value time-series data; and a synchrophasor calculating unit for calculating a synchrophasor by using the voltage instantaneous value time-series estimation data and the voltage effective value.

Effect of the Invention

According to the present invention, the real-time dynamic frequency is first determined by the rotational phase angle frequency measuring method which is previously proposed by the inventor of this application, and the synchrophasor is determined on the basis of the real-time dynamic frequency. Accordingly, a high-speed and high-precision synchrophasor using the real-time measurement value and a phase angle difference between bus lines can be measured. Furthermore, even in a power system in which noise or voltage flicker exists, the synchrophasor and the phase angle difference between bus lines can be measured at high speed/with high precision, and thus the present invention contributes to enhancement of the performance of a power system control protection device.

BRIEF DESCRIPTION OF THE DRAWINGS

FIG. 1 is a diagram showing the construction of a synchrophasor and a phasor measurement unit.

FIG. 2 is a flowchart showing the operation of synchrophasor measurement according to an embodiment 1 of the present invention.

FIG. 3 is a diagram showing a synchrophasor waveform in the embodiment 1 of the present invention.

FIG. 4 is a diagram showing a voltage distortion degree waveform in the embodiment 1 of the present invention.

FIG. 5 is a flowchart showing calculation of a synchrophasor phase angle difference between both bus lines in an embodiment 2 of the present invention.

FIG. 6 is a vector diagram showing a forward-direction mode of the synchrophasor.

FIG. 7 is a vector diagram showing a reverse-direction mode of the synchrophasor.

FIG. 8 is a vector diagram showing a synchrophasor inversion mode 1.

FIG. 9 is a vector diagram showing a synchrophasor inversion mode 2.

FIG. 10 is a vector diagram showing an inter-bus-line synchrophasor phase angle difference increasing mode in the embodiment 2.

FIG. 11 is a vector diagram showing an inter-bus-line synchrophasor phase angle difference decreasing mode in the embodiment 2.

FIG. 12 is a vector diagram showing an inter-bus-line synchrophasor phase angle difference increasing/decreasing mode in the embodiment 2.

FIG. 13 is a vector diagram showing an inter-bus-line synchrophasor phase angle difference decreasing/increasing mode in the embodiment 2.

FIG. 14 is a vector diagram showing an inter-bus-line synchrophasor phase angle difference latch mode 1 in the embodiment 2.

FIG. 15 is a vector diagram showing an inter-bus-line synchrophasor phase angle difference latch mode 2 in the second embodiment.

FIG. 16 is a waveform diagram showing an inter-bus-line synchrophasor phase angle difference in the second embodiment.

FIG. 17 is a time-series variation diagram of the inter-bus-line synchrophasor phase angle difference mode in the second embodiment.

BEST MODES FOR CARRYING OUT THE INVENTION

Embodiment 1

FIG. 1 is a diagram showing the construction of a synchrophasor and a phasor measurement unit according to the present invention. In FIGS. 1, A, B and C represent the names of bus lines, and PT represents a transformer for measuring meters. 1 represents a device for measuring a self-end synchrophasor and a phase angle difference between bus lines as a target of the present invention, and 2 represents a device (PMU) for measuring an other's end synchrophasor and a phase angle difference between bus lines. These devices are constructed by computing machines having the following various function units.

That is, 3 represents a voltage measuring unit that receives actually measured time-series data of the transformer PT for measuring units, 4 represents an A/D converting unit for changing the above time-series analog data to time-series digital data, 5 represents a receiving unit for the other's end synchrophasor and a GPS time, and 6 represents a frequency calculating unit for measuring a real-time frequency of a system according to a dynamic frequency measuring method which has been already proposed by the inventor of this application, and calculates the real-time frequency by determining the amplitude, chord length and rotational phase angle of a voltage rotational vector from the time-series data associated with voltage/current of the system according to an integration method and identifying the frequency variation rate step by step.

7 represents a calculating unit for an input voltage instantaneous value time-series estimation date and an input voltage effective value for estimating a sinusoidal coefficient parameter of an input voltage according to the least square method by using the real-time frequency and the input voltage instantaneous value time-series data. The calculating unit calculates the sinusoidal data of one cycle by using the estimated sinusoidal coefficient parameter (the time pitch of the calculation is set to ¼N of the actually-measured frequency). 8 represents a present-time synchrophasor calculating unit for calculating a synchrophasor by using a present-time voltage estimation value and a voltage effective value, and 9 represents a present-time voltage distortion degree calculating unit, and it defines a voltage distortion degree index and calculates the voltage distortion degree index.

10 represents a synchrophasor GPS time identifying unit between bus lines, and identifies a GPS stamp between both the ends when a GPS stamp is attached to each measurement value and a synchrophasor phase angle difference between bus lines is calculated. 11 represents an inter-bus-line synchrophasor phase angle difference calculating unit. In the phase angle difference calculating unit, some modes are classified, and a synchrophasor phase angle difference is calculated by a calculating equation corresponding to each mode. 12 represents an interface for displaying the calculation result, 13 represents a storage unit for saving a measured value, and 14 represents a measurement result transmitting unit for transmitting a measurement result to another control protection device.

The detailed function of the synchrophasor measuring device will be described according to a flowchart shown in FIG. 2. In the measurement, a reference wave is divided into 4N (N represents a positive integer) parts. In the following development, N=3 and the reference wave is divided into 12 parts. The electric angle is set to 30°, T=0.001388889 second (60 Hz system), and T=0.001666667 second (50 Hz system). As N increases, the measurement precision is enhanced, however, the calculation time is lengthened. A proper N is selected according to the performance of CPU.

First, step 101 is a step of sampling an instantaneous value of a voltage by the voltage measuring unit 3 to make a measurement and executing A/D conversion by the A/D converting unit 4.

The voltage instantaneous value of a circuit can be represented as follows.

According to Fourier Transform, the voltage instantaneous value can be represented as follows (any of phase voltage and inter-line voltage may be used, however, the phase voltage is used in the following description).

$$v(t) = \sqrt{2}\, V e^{j(\omega t + \varphi)} + \sqrt{2} \sum_{k=1}^{M} V_k e^{j(\omega_k t + \varphi_k)} \tag{1}$$

Here, V represents the voltage effective value of the fundamental wave, $\omega$ represents the angular velocity of the fundamental wave, $\phi$ represents the voltage initial phase of the fundamental wave, $V_k$ represents the voltage effective value of k-order higher harmonic wave, $\omega_k$, represents the voltage angular velocity of the k-order higher harmonic wave, $\phi_k$ represents the voltage initial phase of the k-order higher harmonic wave, and M represents a positive integer having any magnitude. That is, the voltage instantaneous value comprises a voltage fundamental wave component and plural voltage higher harmonic wave components.

The voltage rotational vector can be divided to the following real-number part and imaginary-number part.

$$v_{re}(t) = \sqrt{2}\,V\cos(\omega t + \varphi) + \sqrt{2}\sum_{k=1}^{M} V_k \cos(\omega_k t + \varphi_k) \atop v_{im}(t) = \sqrt{2}\,V\sin(\omega t + \varphi) + \sqrt{2}\sum_{k=1}^{M} V_k \sin(\omega_k t + \varphi_k)} \quad (2)$$

In the following development, $v$ represents $v_{re}$.

Next, step 102 represents a step of measuring the real-time frequency, and calculates the real-time frequency according to the dynamic frequency measuring method which is previously proposed by the inventor of this application. That is, the amplitude, chord length and rotational phase angle of the voltage rotational vector are calculated by the integration method to calculate the rotational acceleration of the rotational vector, the rotational acceleration variation rate of the rotational vector is calculated, the frequency variation amount is calculated by using the rotational phase angle variation amount and the dynamic frequency is calculated on the basis of the variation amount between the frequency before one step and the frequency at the present time is calculated. The details are described in the previous application PCT JP/2007/052967.

Step 103 is a calculation step of calculating a phase voltage instantaneous value time-series estimation data, and calculates the phase voltage instantaneous value time-series estimation data of each phase according to the least square method. A specific calculation example will be described below. The fundamental wave voltage instantaneous value can be represented by the equation.

$$v(t) = \sqrt{2}\,V\cos(\omega t + \phi) = P_1 \cos \omega t + P_2 \sin \omega t \quad (3)$$

Here, $\omega$ represents the angular rotational velocity, and it is calculated as follows.

$$\omega = 2\pi f \quad (4)$$

Here, f represents the actually measured real-time frequency, and it is updated every step.

By using the equation (3), the following matrix data is constructed.

$$[v] = [A][P] \quad (5)$$

Here, the voltage actually-measured time-series data is as follows.

$$[v] = \begin{bmatrix} v_1 \\ v_2 \\ \vdots \\ v_{12} \end{bmatrix} \quad (6)$$

The present time voltage actually-measured value is represented by $v_{12}$.

The coefficient matrix of the estimation calculation is as follows.

$$[A] = \begin{bmatrix} \cos\omega t_1 & \sin\omega t_1 \\ \cos\omega t_2 & \sin\omega t_2 \\ \vdots & \vdots \\ \cos\omega t_{12} & \sin\omega t_{12} \end{bmatrix} \quad (7)$$

The time at each point is calculated by the following equation.

$$t_{k+1} = t_k + T,\ k = 0, 2, \ldots, 11,\ t_0 = 0 \quad (8)$$

The fixed time pitch width is calculated as follows.

$$T = \frac{1}{4N}\frac{1}{f_0} = \frac{1}{12}\frac{1}{60} = 0.00138889\ (\text{second}) \quad (9)$$

The coefficient matrix is as follows.

$$[P] = \begin{bmatrix} P_1 \\ P_2 \end{bmatrix} \quad (10)$$

The coefficients are calculated by the least square method as follows.

$$[P] = ([A]^T[A])^{-1}[A]^T[v] \quad (11)$$

The voltage instantaneous value time-series estimation data are calculated as follows.

Step 104 is a step of calculating a present-time voltage effective value. The present-time voltage effective value is calculated as follows.

$$v_{ek} = P_1 \cos \omega t_k + P_2 \sin \omega t_k,\ k = 1, 2, \ldots, 12 \quad (12)$$

Here, the time of each point is as follows.

$$t_{k+1} = t_k + T_1,\ k = 0, 2, \ldots, 11,\ t_0 = 0 \quad (13)$$

In this case, the pitch width is converted on-line, and it is calculated by using the actually-measured frequency $f_1$ as follows.

$$T_1 = \frac{1}{4N}\frac{1}{f_1} = \frac{1}{12 f_1}\ (\text{second}) \quad (14)$$

Therefore, the present-time voltage estimation value is calculated by the following equation.

$$v_{est}(t) = P_1 \cos(12T\omega) + P_2 \sin(12T\omega) \quad (15)$$

$$V(t) = \sqrt{\frac{1}{T_0}\int_{-T_0}^{0} v_e^2\,dt} = \sqrt{\frac{1}{12}\sum_{k=12}^{12} v_{ek}^2} \quad (16)$$

Subsequently, a present-time movement average value is calculated. According to the present invention, the movement average value is calculated during sampling period of one cycle, and data stability is higher as the sampling time is longer.

$$V_{ave}(t) = \frac{1}{12}\sum_{k=0}^{11} V(t-kT) \quad (17)$$

Step 105 is a step of calculating a present-time synchrophasor by using the present-time voltage effective value and the present-time voltage estimation value, and the present-time synchrophasor is calculated by the following equation. As the present-time voltage effective value is used the movement average value thereof.

$$\alpha(t) = \cos^{-1}\left\{\frac{v_{est}(t)}{\sqrt{2}\,V_{ave}(t)}\right\} \quad (18)$$

The unit of the calculation value is set to "radian". If "radian" is multiplied by a coefficient of 180/π, the unit is converted to "Degree (°)". In the following calculation equations, the calculation result is represented by "degree".

According to the synchrophasor measuring device of the present invention, by using the real-time frequency as the dynamic frequency, the calculation precision of the voltage instantaneous value time-series estimation data and the voltage estimation value is greatly enhanced. Furthermore, the voltage instantaneous value time-series estimation data is the estimation value data (perfect sinusoidal data) calculated by the least square method, so that the effect of the frequency variation and the voltage flicker can be greatly reduced at the voltage amplitude (voltage effective value).

Step 106 is a present-time voltage distortion degree calculating step, and the present-time voltage distortion degree is calculated by using the present-time voltage actually-measured instantaneous value and the present-time voltage estimation value according to the following equation.

$$eos(t) = \left|\cos^{-1}\left\{\frac{v_{12}}{\sqrt{2}\,V_{ave}(t)}\right\} - \cos^{-1}\left\{\frac{v_{est}(t)}{\sqrt{2}\,V_{ave}(t)}\right\}\right| \quad (19)$$

Here, eos is an abbreviation of error of synchrophasor, $v_{12}$ represents the present-time voltage actually-measured instantaneous value, and $v_{est}(t)$ represents the present-time voltage estimation value.

The present-time voltage distortion degree calculating step 106 defines and calculates an error index. A conventional error index, for example, TVE (total vector error) index of the Non-patent Document 1 is defined as follows.

$$TVE = \sqrt{\frac{(X_r(n) - X_r)^2 + (X_i(n) - X_i)^2}{X_r^2 + X_i^2}}$$

$X_r(n)$ and $X_i(n)$ represents actually-measured instantaneous values, and $X_r$ and $X_i$ represent data of the fundamental wave of the device. According to this equation, for example, at the variation frequency having no flicker (it is assumed that the rated frequency is equal to 60 Hz and the variation frequency is equal to 62 Hz), a calculation value other than zero certainly exists as the calculation result of TVE. Therefore, when TVE is not equal to zero, it cannot be identified whether it is caused by the frequency variation or the voltage flicker.

On the other hand, in the voltage distortion degree calculating equation of the present invention shown in the equation (19), when the variation frequency having no flicker is measured, the voltage distortion degree eos(t) is equal to zero. However, when a distortion such as a voltage waveform flicker or the like exists in the voltage waveform, any voltage distortion degree eos(t) exists. Accordingly, the voltage distortion degree can be measured only when the distortion such as the voltage waveform flicker or the like exists. Accordingly, it becomes an effective index for monitoring the voltage waveform distortion as one aspect of the power quality monitoring (Power quality) on which importance has been put more and more.

It is determined in step 107 whether the processing is finished or not. If the processing is not finished, the processing returns to step 101.

Next, a simulation result of the present invention will be reviewed.

FIG. 3 shows a simulation waveform of synchrophasor. A synchrophasor (α) measured by the present invention has a result indicated by a heavy line with respect to a phase voltage instantaneous value (v) indicated by a thin line. The design frequency is set to 60 Hz and the input frequency is set to 63 Hz. The synchrophasor is set to a positive value at all times, and it has such a pattern as to increase 0 to 180° and then invert and decrease from 180° to 0.

Furthermore, FIG. 4 shows a simulation waveform of the voltage distortion degree. When the design frequency is set to 60 Hz, the input frequency is set to 63 Hz and a 0.1% random noise value of the input voltage amplitude is imposed on the sinusoidal wave of 63 Hz, a voltage distortion degree measurement result as shown in FIG. 4 is obtained. Accordingly, a case where a distortion such as a voltage waveform flicker or the like exits can be prominently represented.

Embodiment 2

Next, the detailed function of an inter-bus-line synchrophasor phase angle difference measurement unit will be described according to a flowchart of FIG. 5. Terms used in this specification will be first described.

The synchrophasor represents a voltage rotational vector rotating on the complex plane together with the time, and the real-number part thereof (the projection on the X-axis) represents the voltage real-number instantaneous value. When the angle of the voltage rotational vector increases continuously (from zero to 180°) with respect to the synchrophasor variation mode, the synchrophasor variation mode is defined as an increasing direction mode (increasing mode). Conversely, when the angle of the voltage rotational vector decreases continuously (from 180° to zero), the synchrophasor variation mode is defined as a decreasing direction mode (decreasing mode). The synchrophasor variation mode in the other cases is defined as a reversing mode (reversing mode).

The synchrophasor phase angle difference variation mode means a parameter used when the synchrophasor phase angle difference between bus lines is determined. When the synchrophasor variation modes of both the bus lines are simultaneously in the forward direction, the synchrophasor phase angle difference variation is defined as an increasing direction mode (increasing mode). When the synchrophasor phase angle difference variation modes of both the bus lines are in the opposite directions at the same time, the synchrophasor phase angle difference variation mode is defined as a decreasing direction mode (decreasing mode).

When the self-end synchrophasor variation mode is in the increasing direction and the other-end synchrophasor variation mode is in the decreasing direction, the synchrophasor phase angle difference variation mode is defined as an increasing/decreasing direction mode. When the self-end synchrophasor variation mode is in the decreasing direction and the other-end synchrophasor variation mode is in the increasing direction, the synchrophasor phase angle difference variation mode is defined as a decreasing/increasing direction mode. The synchrophasor phase angle difference variation mode in the other cases is defined as a latch mode. The phase angle difference between bus lines can be obtained by calculating the difference between two synchrophasors, however, when the variation mode of one synchrophasor is inverted, it is impossible to settle the difference between this synchrophasor and the other synchrophasor. Accordingly, the latch mode means that the calculation result of the phase angle difference of the previous step is latched.

FIG. 6 is a vector diagram when the synchrophasor variation mode is the increasing direction mode. As described above, when the following condition is satisfied, the synchrophasor at the present time is identified as the increasing direction mode (increasing mode). That is, in the synchrophasor increasing mode, the phase angle of the synchrophasor increases continuously between 0 and 180°.

$$\left.\begin{array}{l}\alpha(t)-\alpha(t-T)>0\\ \alpha(t-T)-\alpha(t-2T)>0\\ 2\alpha(t-T)-\alpha(t-2T)<180\end{array}\right\} \quad (20)$$

Here, $\alpha(t)$ represents the present-time synchrophasor, $\alpha(t-T)$ represents the synchrophasor before one step, and $\alpha(t-2T)$ represents the synchrophasor before two steps.

FIG. 7 is a vector diagram when the synchrophasor variation mode is the decreasing direction mode. When the following condition is satisfied, the synchrophasor at the present time is identified as the decreasing direction mode (decreasing mode). That is, in the synchrophasor decreasing direction mode, the phase angle of the synchrophasor decreases continuously between 0 and 180°.

$$\left.\begin{array}{l}\alpha(t)-\alpha(t-T)<0\\ \alpha(t-T)-\alpha(t-2T)<0\\ \alpha(t-2T)-2\alpha(t-T)<0\end{array}\right\} \quad (21)$$

In the other cases, the synchrophasor at the present time is defined as a reversing mode (reversing mode). FIG. 8 is a vector diagram of a synchrophasor reversing mode 1. FIG. 9 is a vector diagram of a synchrophasor reversing mode 2. The two kinds of reversing modes are shown, however, reversing modes of other patterns may be used in accordance with the pitch width of the measurement sampling.

Next, returning to FIG. 5, the detailed function of the inter-bus-line synchrophasor phase angle difference measuring device will be described. In FIG. 1, when the bus line A is set as a self end, $\alpha_1(t)$ is the phasor of the self-end. When the bus line B is set as other's end, $\alpha_2(t)$ is the phasor at the other's end. Each step of FIG. 5 will be described below.

Step 201 represents a step of receiving an other's end synchrophasor and a GPS time, and receives time-series data of an other's end synchrophasor measurement result (the magnitude of the absolute phase angle) transmitted from PMU of the other's end and corresponding GPS time through a communication line.

Step 202 is a step of identifying the time-series data of the GPS time received in the above step with the time-series data of the GPS time possessed by the self-end device. Step 203 is a step of settling the self-end synchrophasor variation mode, and it settles the self-end synchrophasor variation mode by using the measurement result (absolute phase angle) of the self-end synchrophasor of the present time (the present time after both the time identification between both the time-series data), the measurement result (absolute phase angle) of the self-end synchrophasor before one step and the measurement result (absolute phase angle) of the self-end synchrophasor before two steps.

Step 204 is a step of settling the other's end synchrophasor variation mode, and it settles the other's end synchrophasor variation mode by using the present-time other's end synchrophasor measurement result (absolute phase angle) from the received time-series data, the other's end synchrophasor measurement result (absolute phase angle) before one step and the other's end synchrophasor measurement result (absolute phase angle) before two steps. Step 205 is a step of determining whether the synchrophasor phase angle difference is the increasing mode or not. When the synchrophasor variation modes of both the bus lines are set to the increasing modes at the same time (in the case of FIG. 10), the synchrophasor phase angle difference variation mode is defined as the increasing mode, and the processing goes to step 206. In the other case, the processing goes to step 207.

Step 206 is a step of calculating the synchrophasor phase angle difference in the increasing mode. In the vector diagram of the increasing mode of the inter-bus-line synchrophasor phase angle difference shown in FIG. 10, the phase angle difference between the present-time self-end synchrophasor $\alpha_1(t)$ and the other's end synchrophasor $\alpha_2(t)$ is calculated according to the following equation.

$$\Delta\alpha_{12}(t)=\alpha_1(t)-\alpha_2(t) \quad (22)$$

After the calculation is finished, the processing goes to step 214.

Step 207 is a step of determining whether the synchrophasor phase angle difference is the decreasing mode or not. When the synchrophasor variation modes of both the bus lines are set to the decreasing modes at the same time (in the case of FIG. 11), the synchrophasor phase angle difference variation mode is defined as the decreasing mode, and the processing goes to step 208. In the other cases, the processing goes to step 209. In step 208, the synchrophasor phase angle difference in the decreasing mode is calculated, and in the vector diagram of the decreasing mode of the inter-bus-line synchrophasor phase angle difference shown in FIG. 11, the phase angle difference between the present-time self-end synchrophasor $\alpha_1(t)$ and the other's end synchrophasor $\alpha_2(t)$ is calculated according to the following equation.

$$\Delta\alpha_{12}(t)=\alpha_2(t)-\alpha_1(t) \quad (23)$$

After the calculation is finished, the processing goes to step 214.

Furthermore, step 209 is a step of determining whether the synchrophasor phase angle difference is the increasing/decreasing mode. When the self-end synchrophasor mode is in the increasing direction and the other's end synchrophasor mode is in the decreasing direction (in the case of FIG. 12), the processing goes to step 210. In the other case, the processing goes to step 211. Step 210 is a step of calculating the synchrophasor phase angle difference in the increasing/decreasing mode, and in the vector diagram of the increasing/decreasing mode of the inter-bus-line synchrophasor phase angle difference shown in FIG. 12, the phase angle difference between the present-time self-end synchrophasor $\alpha_1(t)$ and the other's end synchrophasor $\alpha_2(t)$ is calculated according to the following equation.

$$\Delta\alpha_{12}(t)=\alpha_2(t)+\alpha_1(t) \quad (24)$$

After the calculation is finished, the processing goes to step 214.

Step 211 is a step for determining whether the synchrophasor phase angle difference is the decreasing/increasing mode or not. When the self-end synchrophasor mode is in the decreasing direction and the other's end synchrophasor mode is in the increasing direction (in the case of FIG. 13), the processing goes to step 212. In the other cases, the processing goes to step 213. In step 212, the synchrophasor phase angle difference in the decreasing/increasing mode is calculated, and in the vector diagram of the decreasing/increasing mode of the inter-bus-line synchrophasor phase angle difference shown in FIG. 13, the phase angle difference between the present-time self-end phasor $\alpha_1(t)$ and the other's end synchrophasor $\alpha_2(t)$ is calculated according to the following equation.

$$\Delta\alpha_{12}(t)=360-\alpha_2(t)-\alpha_1(t) \quad (25)$$

After the calculation is finished, the processing goes to step 214.

Step 213 is a step for latching the synchrophasor phase angle difference in the latch mode. The value before one step is latched as the phase angle difference between the present-time self-end synchrophasor and the other's end synchrophasor.

$$\Delta\alpha_{12}(t)=\Delta\alpha_{12}(t-T) \quad (26)$$

FIG. 14 is a vector diagram of a latch mode 1 of the inter-bus-line synchrophasor phase angle difference, and FIG. 15 is a vector diagram of a latch mode 2 of the inter-bus-line synchrophasor phase angle difference. The two kinds of latch modes are shown. However, other kinds of latch mode may be used in accordance with the sampling pitch width of the measurement and the value of the inter-bus-line synchrophasor phase angle difference. After the calculation is finished, the processing goes to step 214.

Finally, it is determined in step 214 whether the processing is finished or not. If the processing is not finished, the processing returns to step 203.

Next, a simulation result of the embodiment 2 will be described.

FIG. 16 is a waveform diagram obtained by simulating the inter-bus-line synchrophasor phase angle difference in the embodiment 2, and the simulation condition is as follows. The predetermined system rated frequencies of the bus line A and the bus line B are set to 60 Hz, and the design frequencies of both PMUs are set to 60 Hz in fundamental wave. With respect to the sampling frequency, the reference wave is divided into 12 parts, the calculation pitch width is set to 30° in electrical angle, and T=1/60/12=0.00138889 second. The actually input frequencies of both the bus lines are set to 63 Hz, and the input voltage waveforms of both the bus lines are set to a perfect sinusoidal wave having no flicker. The difference between the initial phase angles of input data of the bus line A and the bus line B is set to 80° (Degree).

As is apparent from FIG. 16, the absolute phase angle of the synchrophasor of each of the bus line A and the bus line B increases from 0 to 180°, and then inverts and decreases from 180° to 0. The absolute phase angle further inverts again and increases. As described above, it is apparent that the absolute phase angle is fluctuated between 0 and 180°. The measurement result of the phase angle difference between both the bus lines indicates a straight line of 80° although there is frequency fluctuation (rated frequency of 63 Hz different from 60 Hz). Accordingly, it is apparent that the measurement result is not a pulse-shape unlike the conventional method, but numerically stabilized.

FIG. 17 is a diagram showing time-series variation of the inter-bus-line synchrophasor phase angle difference mode in the same case as shown in FIG. 16. In FIG. 17, the ordinate axis represents the type of the mode, and the abscissa axis represents the time. The numerical value of the mode is determined as follows. The mode 1 corresponds to the increasing mode, and the phase angle difference between the bus line A and the bus line B is calculated according to the equation (22). (The absolute phase angle of the bus line A is represented by $\alpha_1(t)$, the absolute phase angle of the bus line B is represented by $\alpha_2(t)$, and the phase angle difference between the bus lines A and B is represented by $\alpha_{12}(t)$). The mode 2 is the decreasing mode, and the phase angle difference between the bus line A and the bus line B is calculated according to the equation (23). The mode 3 is the increasing/decreasing mode, and the phase angle difference between the bus line A and the bus line B is calculated according to the equation (24).

The mode 4 is the decreasing/increasing mode, and the phase angle difference between the bus line A and the bus line B is calculated according to the equation (25). The mode 5 is the latch mode, and the value before one step is latched as the phase angle difference between the bus line A and the bus line B (the equation (26)). In this case, the measurement is performed through 30° sampling, however, when another sampling pitch width (for example, 7.5° sampling) is used, the same result is obtained with respect to the inter-bus-line synchrophasor phase angle difference, however, the time-series diagram of the inter-bus-line synchrophasor phase angle difference mode is different. In any case, the five modes of the increasing mode, the decreasing mode, the increasing/decreasing mode, the decreasing/increasing mode and the latch mode exist likewise.

INDUSTRIAL APPLICABILITY

The present invention is applicable to the power system control protection device, but also a power system long period fluctuation control device and a power system step-out detecting relay protection device.

The invention claimed is:
1. A synchrophasor measuring device, comprising:
a voltage measuring unit for measuring a time-series data associated with a system voltage;
a frequency calculating unit for determining the amplitude, chord length and rotational phase angle of a voltage rotational vector from the time-series data obtained by the voltage measuring unit and calculating a real-time frequency;
a voltage instantaneous value time-series estimation data and voltage effective value calculating unit for calculating a voltage instantaneous value time-series estimation data and a voltage effective value for estimating a sinusoidal coefficient parameter by using the real-time frequency and voltage instantaneous value time-series data of respective phase components;
a synchrophasor calculating unit for calculating a synchrophasor by using the voltage instantaneous value time-series estimation data and the voltage effective value; and a voltage distortion degree calculating unit for calculating a voltage distortion degree by using the calculated synchrophasor, the voltage effective value and a voltage actually-measured value.

2. The synchrophasor measuring device according to claim 1, wherein the synchrophasor α(t) is calculated by using a voltage instantaneous value time-series estimation data $v_{est}(t)$ and a movement average value $V_{ave}(t)$ as the voltage effective value according to the following equation:

$$\alpha(t) = \cos^{-1}\left\{\frac{v_{est}(t)}{\sqrt{2}\,V_{ave}(t)}\right\}.$$

3. The synchrophasor measuring device according to claim 1, wherein the voltage distortion degree eos(t) is calculated by using a present-time voltage actually-measured instantaneous value $v_{12}$ and a present-time voltage estimation value $v_{est}(t)$ according to the following equation:

$$eos(t) = \left|\cos^{-1}\left\{\frac{v_{12}}{\sqrt{2}\,V_{ave}(t)}\right\} - \cos^{-1}\left\{\frac{v_{est}(t)}{\sqrt{2}\,V_{ave}(t)}\right\}\right|.$$

4. An inter-bus-line phase angle difference measurement unit comprising:
  a synchrophasor measuring device, comprising:
    a frequency calculating unit for determining the amplitude, chord length and rotational phase angle of a voltage rotational vector from the time-series data obtained by the voltage measuring unit and calculating a real-time frequency;
    a voltage instantaneous value time-series estimation data and voltage effective value calculating unit for calculating a voltage instantaneous value time-series estimation data and a voltage effective value for estimating a sinusoidal coefficient parameter by using the real-time frequency and voltage instantaneous value time-series data of respective phase components; and
    a synchrophasor calculating unit for calculating a synchrophasor by using the voltage instantaneous value time-series estimation data and the voltage effective value;
  a synchrophasor calculating unit for calculating synchrophasors of plural bus lines; an inter-bus-line synchrophasor GPS time identifying unit for identifying time-series data of a GPS time of a predetermined bus line with time-series data of a GPS time of another bus line; and
  an inter-bus-line synchrophasor phase angle difference calculating unit for calculating a synchrophasor phase angle difference between the bus lines by settling a variation mode of the synchrophasors of both the bus lines.

5. The inter-bus-line phase angle difference measurement unit according to claim 4, wherein variation modes of periodically-varying synchrophasors are defined as an increasing mode, a decreasing mode and a reversing mode, and inter-bus-line synchrophasor phase angle difference modes are defined as an increasing mode, a decreasing mode, an increasing/decreasing mode, a decreasing/increasing mode and a latch mode, thereby calculating a synchrophasor phase angle difference between bus lines.

\* \* \* \* \*